US012107616B2

(12) United States Patent
Nakazawa

(10) Patent No.: US 12,107,616 B2
(45) Date of Patent: Oct. 1, 2024

(54) HIGH FREQUENCY MODULE AND COMMUNICATION APPARATUS

(71) Applicant: Murata Manufacturing Co., Ltd., Kyoto (JP)

(72) Inventor: Katsunari Nakazawa, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 365 days.

(21) Appl. No.: 17/661,586

(22) Filed: May 2, 2022

(65) Prior Publication Data

US 2022/0263533 A1    Aug. 18, 2022

Related U.S. Application Data

(63) Continuation of application No. PCT/JP2020/031003, filed on Aug. 17, 2020.

(30) Foreign Application Priority Data

Dec. 10, 2019    (JP) ................. 2019-223229

(51) Int. Cl.
*H04B 1/40*    (2015.01)
*H03F 3/21*    (2006.01)
(Continued)

(52) U.S. Cl.
CPC ............... *H04B 1/40* (2013.01); *H03F 3/211* (2013.01); *H03F 3/245* (2013.01); *H04B 1/04* (2013.01); *H04B 2001/0408* (2013.01)

(58) Field of Classification Search
CPC .... H04B 1/40; H04B 1/04; H04B 2001/0408; H03F 3/211; H03F 3/245
(Continued)

(56) References Cited

U.S. PATENT DOCUMENTS 10,950,569 B2 *    3/2021    Nakazawa ........... H01L 23/3677
10,971,466 B2 *    4/2021    Nakazawa ............ H03F 1/301
(Continued)

FOREIGN PATENT DOCUMENTS

JP    2014-522216 A    8/2014
JP    2016-046548 A    4/2016
(Continued)

OTHER PUBLICATIONS

International Search Report for International Patent Application No. PCT/JP2020/031003 dated Oct. 13, 2020.

*Primary Examiner* — April G Gonzales
(74) *Attorney, Agent, or Firm* — Pearne & Gordon LLP

(57) ABSTRACT

A power amplifier is capable of operating in a first power mode and a second power mode with a gain lower than a gain of the first power mode. The power amplifier is connected to a first common terminal of the first switch. Two or more filters are connected to two or more first selection terminals other than at least one first selection terminal among three or more first selection terminals of the first switch. The at least one first selection terminal of the first switch and at least one second selection terminal of a second switch are connected. The first switch is capable of switching between a first path passing through at least one of the two or more filters and a second path not passing through any of the two or more filters but passing through the at least one first selection terminal.

12 Claims, 7 Drawing Sheets

(51) Int. Cl.
*H03F 3/24* (2006.01)
*H04B 1/04* (2006.01)

(58) Field of Classification Search
USPC ......................................... 455/100
See application file for complete search history.

(56) References Cited

U.S. PATENT DOCUMENTS

| | | | |
|---|---|---|---|
| 2013/0043946 A1* | 2/2013 | Hadjichristos | H03F 3/68 330/252 |
| 2014/0097999 A1* | 4/2014 | Murase | H01Q 21/0006 333/101 |
| 2014/0167856 A1* | 6/2014 | Takahashi | H03F 3/245 330/295 |
| 2018/0069574 A1* | 3/2018 | Kondo | H03F 3/72 |
| 2018/0227008 A1* | 8/2018 | Obiya | H04B 1/0458 |
| 2023/0411376 A1* | 12/2023 | Ono | H01L 24/08 |
| 2024/0038692 A1* | 2/2024 | Yamada | H03H 9/25 |

FOREIGN PATENT DOCUMENTS

| | | |
|---|---|---|
| JP | 2018-042100 A | 3/2018 |
| WO | 2017/057568 A1 | 4/2017 |

\* cited by examiner

HIGH FREQUENCY MODULE AND COMMUNICATION APPARATUS

CROSS REFERENCE TO RELATED APPLICATION

This is a continuation of International Application No. PCT/JP2020/031003 filed on Aug. 17, 2020 which claims priority from Japanese Patent Application No. 2019-223229 filed on Dec. 10, 2019. The contents of these applications are incorporated herein by reference in their entireties.

BACKGROUND OF THE DISCLOSURE

Field of the Disclosure

The present disclosure relates, in general, to a high frequency module and a communication apparatus and, more particularly, to a high frequency module including a power amplifier and to a communication apparatus including the high frequency module.

Description of the Related Art Description of the Related Art

Front end modules (high frequency modules) each including a power amplifier, a plurality of switches, a plurality of transmission filters or a plurality of duplexers, and a switchplexer have been known (see, for example, Patent Document 1). The power amplifier is coupled to the plurality of transmission filters or the plurality of duplexers with the plurality of switches interposed therebetween. The switchplexer is connected to an antenna and can be connected to the plurality of transmission filters or the plurality of duplexers.

The power amplifier amplifies an output RF signal.

Furthermore, a transceiver (communication apparatus) including a front end module and an RFIC is described in Patent Document 1. The front end module is coupled to an antenna. The RFIC is coupled to the front end module.

Patent Document 1: Japanese Unexamined Patent Application Publication (Translation of PCT Application) No. 2014-522216

BRIEF SUMMARY OF THE DISCLOSURE

Reducing current consumption in a high frequency module such as a front end module disclosed in Patent Document 1 may be desirable.

An object of the present disclosure is to provide a high frequency module and a communication apparatus that are capable of achieving a reduction of the current consumption.

A high frequency module according to an aspect of the present disclosure includes a power amplifier, a first switch, two or more filters, a second switch, and an antenna terminal. The power amplifier is capable of operating in a first power mode and a second power mode with a gain lower than a gain of the first power mode. The first switch includes a first common terminal and three or more first selection terminals, and the power amplifier is connected to the first common terminal. The two or more filters are connected to two or more first selection terminals other than at least one first selection terminal among the three or more first selection terminals of the first switch. The second switch includes a second common terminal and three or more second selection terminals, and the two or more filters are connected to two or more second selection terminals other than at least one second selection terminal among the three or more second selection terminals. The antenna terminal is connected to the second common terminal. The at least one first selection terminal of the first switch and the at least one second selection terminal of the second switch are connected. The first switch is capable of switching between a first path passing through at least one of the two or more filters and a second path not passing through any of the two or more filters but passing through the at least one first selection terminal.

A communication apparatus according to an aspect of the present disclosure includes a signal processing circuit and the high frequency module described above. The power amplifier of the high frequency module amplifies a transmission signal from the signal processing circuit and outputs the amplified transmission signal.

A high frequency module and a communication apparatus according to an aspect of the present disclosure described above can achieve a reduction of the current consumption.

DETAILED DESCRIPTION OF THE DISCLOSURE

Figure 1:
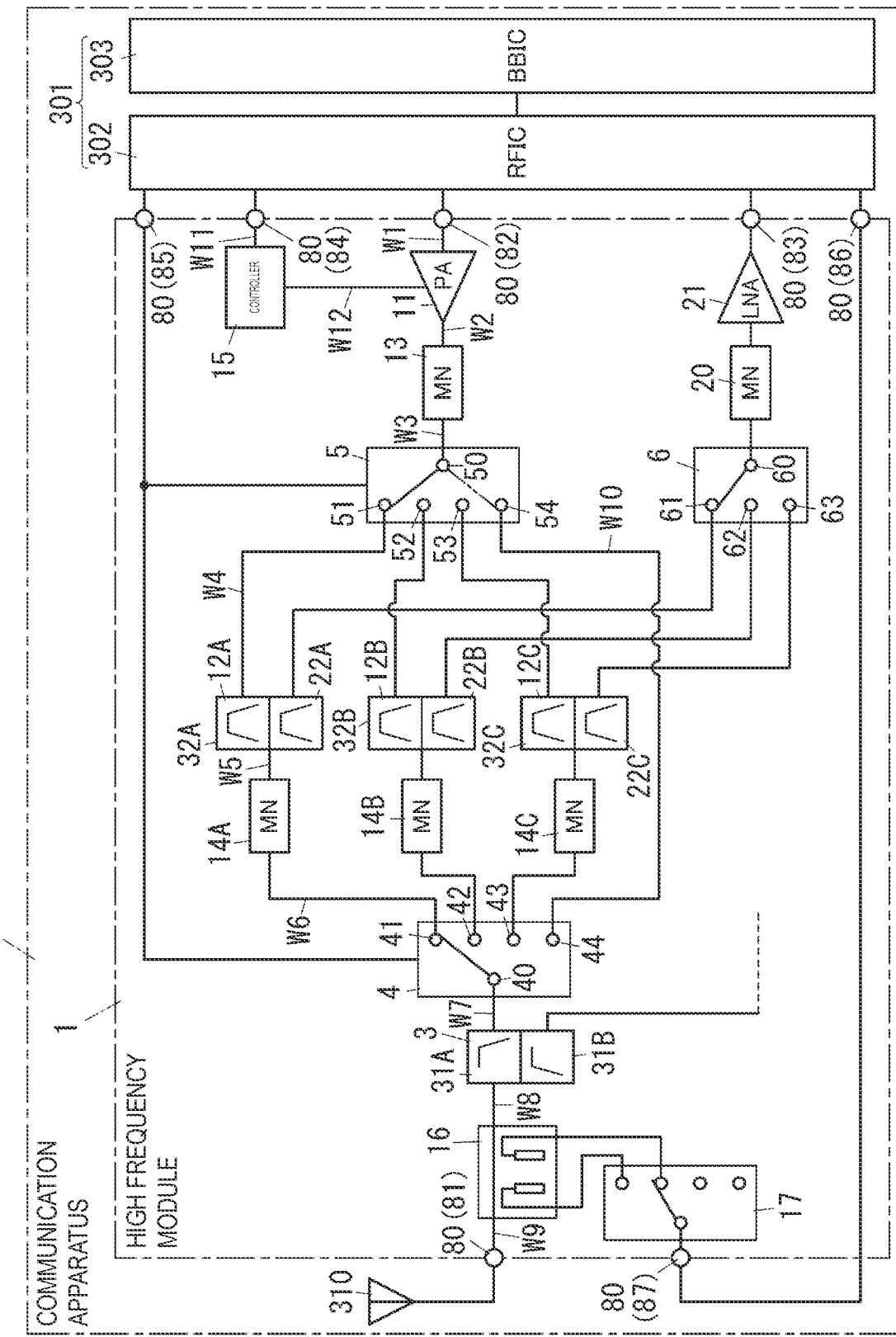
FIG. 1 is a circuit diagram of a high frequency module and a communication apparatus including the high frequency module according to a first embodiment.

FIGS. 2 to 6, which will be referred to in embodiments and the like described below, are schematic diagrams. The ratio of the sizes and thicknesses of components in the figures do not necessarily reflect the actual ratio.

First Embodiment

Hereinafter, a high frequency module 1 and a communication apparatus 300 according to a first embodiment will be described with reference to FIGS. 1 and 2.

(1) High Frequency Module and Communication Apparatus
(1.1) Circuit Configuration of High Frequency Module and Communication Apparatus A circuit configuration of the high frequency module 1 and the communication apparatus 300 according to the first embodiment will be described with reference to FIG. 1.

The high frequency module 1 according to the first embodiment is used for, for example, the communication apparatus 300. The communication apparatus 300 is, for example, a cellular phone (for example, a smartphone).

However, the communication apparatus 300 is not necessarily a cellular phone and may be a wearable terminal (for example, a smartwatch) or the like. The high frequency module 1 is a module capable of supporting, for example, 4 G (fourth generation mobile communication) standards and/or 5 G (fifth generation mobile communication) standards. The 4 G standards are, for example, 3GPP LTE (Long Term Evolution) standards. The 5G standards are, for example, 5 G NR (New Radio). The high frequency module 1 is a module capable of supporting carrier aggregation and dual connectivity.

The high frequency module 1 is configured to, for example, amplify a transmission signal inputted from a signal processing circuit 301 and output the amplified transmission signal to an antenna 310. The high frequency module 1 is also configured to amplify a reception signal inputted from the antenna 310 and output the amplified reception signal to the signal processing circuit 301. The signal processing circuit 301 is not a component of the high frequency module 1 but a component of the communication apparatus 300 including the high frequency module 1. For example, the high frequency module 1 according to the first embodiment is controlled by the signal processing circuit 301 provided in the communication apparatus 300. The communication apparatus 300 includes the high frequency module 1 and the signal processing circuit 301. The communication apparatus 300 further includes the antenna 310. The communication apparatus 300 further includes a circuit substrate on which the high frequency module 1 is mounted. The circuit substrate is, for example, a printed wiring board. The circuit substrate includes a ground electrode to which a ground potential is applied.

The signal processing circuit 301 includes, for example, an RF signal processing circuit 302 and a baseband signal processing circuit 303. The RF signal processing circuit 302 is, for example, an RFIC (Radio Frequency Integrated Circuit) and performs signal processing on a high frequency signal. For example, the RF signal processing circuit 302 performs signal processing such as up-conversion on a high frequency signal (transmission signal) outputted from the baseband signal processing circuit 303 and outputs the high frequency signal on which the signal processing has been performed. Furthermore, for example, the RF signal processing circuit 302 performs signal processing such as down-conversion on a high frequency signal (reception signal) outputted from the high frequency module 1 and outputs the high frequency signal on which the signal processing has been performed to the baseband signal processing circuit 303. The baseband signal processing circuit 303 is, for example, a BBIC (Baseband Integrated Circuit). The baseband signal processing circuit 303 generates an I-phase signal and a Q-phase signal from a baseband signal. The baseband signal is, for example, an audio signal, an image signal, or the like inputted from the outside. The baseband signal processing circuit 303 combines the I-phase signal with the Q-phase signal to perform IQ modulation and outputs a transmission signal. At this time, the transmission signal is generated as a modulation signal (IQ signal) obtained by performing amplitude modulation of a carrier wave signal at a predetermined frequency with a period longer than the period of the carrier wave signal. The reception signal processed by the baseband signal processing circuit 303 is used as, for example, an image signal for image display or an audio signal for conversation. The high frequency module 1 transfers a high frequency signal (reception signal, transmission signal) between the antenna 310 and the RF signal processing circuit 302 of the signal processing circuit 301.

The high frequency module 1 according to the first embodiment includes a power amplifier 11, two or more (for example, three) filters 32A to 32C, a first switch 5, a second switch 4, and an antenna terminal 81. The power amplifier 11 is capable of operating in a first power mode (for example, a high power mode) and a second power mode (for example, a low power mode) with a gain lower than the gain of the first power mode. The first switch 5 includes a first common terminal 50 and three or more (for example, four) first selection terminals 51 to 54, and the power amplifier 11 is connected to the first common terminal 50. The three filters 32A to 32C are connected to two or more (for example, three) first selection terminals 51 to 53 other than at least one first selection terminal 54 among the three or more (for example, four) first selection terminals 51 to 54 of the first switch 5. The second switch 4 includes a second common terminal 40 and three or more (for example, four) second selection terminals 41 to 44. The two or more (for example, three) filters 32A to 32C are connected to two or more (for example, three) second selection terminals 41 to 43 other than at least one second selection terminal 44 among the three or more (for example, four) second selection terminals 41 to 44. The antenna terminal 81 is connected to the second common terminal 40. The at least one first selection terminal 54 of the first switch 5 and the at least one second selection terminal 44 of the second switch 4 are connected.

Furthermore, the high frequency module 1 according to the first embodiment further includes an output matching circuit 13 that is provided between an output terminal of the power amplifier 11 and the first common terminal 50 of the first switch 5. The high frequency module 1 further includes three matching circuits 14A to 14C that are provided at the corresponding signal paths between the three filters 32A to 32C and the second switch 4. The high frequency module 1 further includes a controller 15. The controller 15 controls the power amplifier 11. The high frequency module 1 further includes a signal input terminal 82 to which an input terminal of the power amplifier 11 is connected and a control terminal 84 to which the controller 15 is connected.

Furthermore, in the high frequency module 1, each of the three filters 32A to 32C is a duplexer. The filter 32A includes a transmission filter 12A and a reception filter 22A. The filter 32B includes a transmission filter 12B and a reception filter 22B. The filter 32C includes a transmission filter 12C and a reception filter 22C. The high frequency module 1 according to the first embodiment further includes a third switch 6, a low noise amplifier 21, and an input matching circuit 20. The third switch 6 includes a third common terminal 60 and two or more (for example, three) third selection terminals 61 to 63. The low noise amplifier 21 is connected to the third common terminal 60. The input matching circuit 20 is provided between the third common terminal 60 of the third switch 6 and an input terminal of the low noise amplifier 21. The high frequency module 1 further includes a signal output terminal 83 to which an output terminal of the low noise amplifier 21 is connected.

The high frequency module 1 according to the first embodiment further includes a multiplexer (for example, a diplexer) 3, a coupler 16, and a fourth switch 17. The multiplexer 3 is connected to the antenna terminal 81 with the coupler 16 interposed therebetween. The coupler 16 and the fourth switch 17 configure a circuit for monitoring the power strength of a high frequency signal transferred between the antenna terminal 81 and the multiplexer 3. The circuit outputs the monitored power strength to the signal processing circuit 301 or the like through a monitor output terminal 87.

(1.2) Components in Circuit Configuration of High Frequency Module (1.2.1) Power Amplifier For example, the power amplifier 11 amplifies a transmission signal from the signal processing circuit 301 and outputs the amplified transmission signal. The power amplifier 11 amplifies an input transmission signal of a predetermined frequency band and outputs the amplified transmission signal. The predetermined frequency band includes, for example, a first communication band, a second communication band, and a third communication band. The first communication band is a communication band corresponding to a transmission signal passing through (the transmission filter 12A of) the filter 32A. The second communication band is a communication band corresponding to a transmission signal passing through (the transmission filter 12B of) the filter 32B. The third communication band is a communication band corresponding to a transmission signal passing through (the transmission filter 12C of) the filter 32C.

The power amplifier 11 includes the input terminal and the output terminal. The input terminal of the power amplifier 11 is connected to the signal input terminal 82. The input terminal of the power amplifier 11 can be connected to the signal processing circuit 301 with the signal input terminal 82 interposed therebetween. The signal input terminal 82 is a terminal through which a high frequency signal (transmission signal) from an external circuit (for example, the signal processing circuit 301) is inputted to the high frequency module 1. The output terminal of the power amplifier 11 is connected to the output matching circuit 13.

The power amplifier 11 includes, for example, a driver-stage amplifier, an output-stage amplifier, and an inter-stage matching circuit. The output-stage amplifier is connected in series with an output side of the driver-stage amplifier. The amplification factor of the driver-stage amplifier is lower than the amplification factor of the output-stage amplifier. The inter-stage matching circuit is connected between the driver-stage amplifier and the output-stage amplifier. The inter-stage matching circuit performs impedance matching between the driver-stage amplifier and the output-stage amplifier. The inter-stage matching circuit is, for example, an inductor provided between the driver-stage amplifier and the output-stage amplifier. However, the inter-stage matching circuit may further include a capacitor, in addition to the inductor. The power amplifier 11 further includes a first bias circuit that supplies a first bias voltage to an amplifying transistor included in the driver-stage amplifier and a second bias circuit that supplies a second bias voltage to an amplifying transistor included in the output-stage amplifier.

In the power amplifier 11, an input terminal of the driver-stage amplifier is connected to the signal input terminal 82. The input terminal of the driver-stage amplifier is connected to the signal processing circuit 301 with the signal input terminal 82 interposed therebetween. In the power amplifier 11, an output terminal of the output-stage amplifier is connected to the first common terminal 50 of the first switch 5 with the output matching circuit 13 interposed therebetween. The power amplifier 11 is controlled by the controller 15.

As described above, the power amplifier 11 is capable of operating in the first power mode (for example, the high power mode) and the second power mode (for example, the low power mode) with a gain lower than the gain of the first power mode. The power amplifier 11 is configured to be capable of switching the type of an amplifier (the driver-stage amplifier, the output-stage amplifier, etc.) or the number of amplifiers between operation in the first power mode and operation in the second power mode. In the case where the power amplifier 11 operates in the first power mode, for example, an input high frequency signal is amplified by the driver-stage amplifier, is further amplified by the output-stage amplifier, and is then outputted. In the case where the power amplifier 11 operates in the second power mode, for example, an input high frequency signal is not amplified by the driver-stage amplifier but is amplified by the output-stage amplifier, and is then outputted. The power amplifier 11 in the second power mode does not necessarily operate as described above. For example, in the power amplifier 11 in the second power mode, an input high frequency signal may be amplified by the driver-stage amplifier without going through the amplification by the output-stage amplifier, and may then be outputted. Furthermore, in the power amplifier 11, the output-stage amplifier may include two amplifiers that are arranged in parallel to each other and have different amplification factors. In this case, the power amplifier 11 may be configured such that one of the two amplifiers that has a higher amplification factor operates in the first power mode and the other one of the two amplifiers that has a lower amplification factor operates in the second power mode. The power amplifier 11 may be capable of operating in an envelope tracking mode, in addition to the first power mode and the second power mode.

(1.2.2) Filter

The filter 32A is a duplexer and includes the transmission filter 12A and the reception filter 22A. The filter 32B is a duplexer and includes the transmission filter 12B and the reception filter 22B. The filter 32C is a duplexer and includes the transmission filter 12C and the reception filter 22C.

The transmission filter 12A is, for example, a filter having a transmission band of the first communication band as a pass band. The transmission filter 12B is, for example, a filter having a transmission band of the second communication band as a pass band. The transmission filter 12C is, for example, a filter having a transmission band of the third communication band as a pass band.

The reception filter 22A is, for example, a filter having a reception band of the first communication band as a pass band. The reception filter 22B is, for example, a filter having a reception band of the second communication band as a pass band. The reception filter 22C is, for example, a filter having a reception band of the third communication band as a pass band.

(1.2.3) First Switch

The first switch 5 includes the first common terminal 50 and the four first selection terminals 51 to 54. The first common terminal 50 is connected to the output terminal of the power amplifier 11 with the output matching circuit 13 interposed therebetween. The first selection terminal 51 is connected to the filter 32A. The first selection terminal 51 is connected to an input terminal of the transmission filter 12A (a transmission terminal of a duplexer configuring the filter 32A). The first selection terminal 52 is connected to the filter 32B. The first selection terminal 52 is connected to an input terminal of the transmission filter 12B (a transmission terminal of a duplexer configuring the filter 32B). The first selection terminal 53 is connected to the filter 32C. The first selection terminal 53 is connected to an input terminal of the transmission filter 12C (a transmission terminal of a duplexer configuring the filter 32C). The first selection terminal 54 is connected to none of the three filters 32A to 32C. The first selection terminal 54 is connected to the second selection terminal 44 of the second switch 4. The first switch 5 is, for example, a switch that is capable of allowing at least one or more of the four first selection terminals 51 to 54 to be connected to the first common terminal 50. The first switch 5 is, for example, a switch that is capable of one-to-one connection and one-to-many connection. The first switch 5 is a switch having a function for switching among signal paths for transmission signals of different communication bands.

The first switch 5 is controlled by a circuit (for example, the signal processing circuit 301) outside the high frequency module 1. The first switch 5 supports, for example, MIPI (Mobile Industry Processor Interface) standards. For example, the first switch 5 performs switching of the state of the connection between the first common terminal 50 and each of the four first selection terminals 51 to 54 in accordance with a control signal from the signal processing circuit 301 inputted through a control terminal 85. The first switch 5 is, for example, a switch IC (Integrated Circuit).

(1.2.4) Second Switch

The second switch 4 includes the second common terminal 40 and the four second selection terminals 41 to 44. The second switch 4 is a switch connected to the antenna terminal 81. In the second switch 4, the second common terminal 40 is connected to the antenna terminal 81. More specifically, the second common terminal 40 is connected to the antenna terminal 81 with a low pass filter 31A of the multiplexer 3 and the coupler 16 interposed therebetween. The antenna 310 is connected to the antenna terminal 81. The second selection terminal 41 is connected to the filter 32A. The second selection terminal 41 is connected to the transmission filter 12A and the reception filter 22A of the filter 32A. The second selection terminal 42 is connected to the filter 32B. The second selection terminal 42 is connected to the transmission filter 12B and the reception filter 22B. The second selection terminal 43 is connected to the filter 32C. The second selection terminal 43 is connected to the transmission filter 12C and the reception filter 22C. The second selection terminal 44 is connected to the first selection terminal 54 of the first switch 5. The second switch 4 is, for example, a switch capable of allowing at least one or more of the four second selection terminals 41 to 44 to be connected to the second common terminal 40. The second switch 4 is, for example, a switch capable of one-to-one connection and one-to-many connection.

The second switch 4 is provided at a signal path for a transmission signal and a signal path for a reception signal. In the high frequency module 1, the second switch 4 is provided at a signal path for a transmission signal on which the power amplifier 11, the output matching circuit 13, the first switch 5, and the transmission filter 12A are provided. Furthermore, the second switch 4 is provided at a signal path for a transmission signal on which the power amplifier 11, the output matching circuit 13, the first switch 5, and the transmission filter 12B are provided. Furthermore, the second switch 4 is provided at a signal path for a transmission signal on which the power amplifier 11, the output matching circuit 13, the first switch 5, and the transmission filter 12C are provided. Furthermore, the second switch 4 is provided at a signal path for a reception signal on which the reception filter 22A, the third switch 6, and the low noise amplifier 21 are provided. Furthermore, the second switch 4 is provided at a signal path for a reception signal on which the reception filter 22B, the third switch 6, and the low noise amplifier 21 are provided. Furthermore, the second switch 4 is provided at a signal path for a reception signal on which the reception filter 22C, the third switch 6, and the low noise amplifier 21 are provided.

The second switch 4 is controlled by a circuit (for example, the signal processing circuit 301) outside the high frequency module 1. The second switch 4 supports, for example, MIPI standards. For example, the second switch 4 performs switching of the state of the connection between the second common terminal 40 and each of the four second selection terminals 41 to 44 in accordance with a control signal from the signal processing circuit 301 inputted through the control terminal 85. The second switch 4 is, for example, a switch IC.

(1.2.5) Third Switch

The third switch 6 includes the third common terminal 60 and the three third selection terminals 61 to 63. The third common terminal 60 is connected to an input terminal of the low noise amplifier 21. The third selection terminal 61 is connected to the filter 32A. The third selection terminal 61 is connected to an output terminal of the reception filter 22A (a reception terminal of the duplexer configuring the filter 32A). The third selection terminal 62 is connected to the filter 32B. The third selection terminal 62 is connected to an output terminal of the reception filter 22B (a reception terminal of the duplexer configuring the filter 32B). The third selection terminal 63 is connected to the filter 32C. The third selection terminal 63 is connected to an output terminal of the reception filter 22C (a reception terminal of the duplexer configuring the filter 32C). The third switch 6 is, for example, a switch capable of allowing at least one or more of the three third selection terminals 61 to 63 to be connected to the third common terminal 60. The third switch 6 is, for example, a switch capable of one-to-one connection and one-to-many connection.

The third switch 6 is controlled by a circuit (for example, the signal processing circuit 301) outside the high frequency module 1. The third switch 6 supports, for example, MIPI standards. For example, the third switch 6 performs switching of the state of the connection between the third common terminal 60 and each of the three third selection terminals 61 to 63 in accordance with a control signal inputted from the signal processing circuit 301. The third switch 6 is, for example, a switch IC.

(1.2.6) Fourth Switch

The fourth switch 17 is provided between the coupler 16 and the monitor output terminal 87 and performs switching of the state of the connection between the coupler 16 and the monitor output terminal 87. The fourth switch 17 is controlled by a circuit (for example, the signal processing circuit 301) outside the high frequency module 1. The fourth switch 17 supports, for example, MIPI standards. The fourth switch 17 is, for example, a switch IC.

(1.2.7) Coupler

The coupler 16 includes a main line provided between the antenna terminal 81 and the second switch 4 so that the power strength of a high frequency signal transferred between the antenna terminal 81 and the second switch 4 is monitored. The power strength monitored by the coupler 16 is outputted to a circuit (for example, the signal processing circuit 301) outside the high frequency module 1 through the fourth switch 17 and the monitor output terminal 87.

(1.2.8) Output Matching Circuit

The output matching circuit 13 is provided at a signal path between the output terminal of the power amplifier 11 and the first common terminal 50 of the first switch 5. The output matching circuit 13 is a circuit for performing the impedance matching between the power amplifier 11 and each of the filters 32A to 32C. For example, the output matching circuit 13 is configured to be a single inductor. However, the output matching circuit 13 is not necessarily configured to be a single inductor and may include, for example, a plurality of inductors and a plurality of capacitors.

(1.2.9) Matching Circuit

The three matching circuits 14A to 14C are circuits for performing the impedance matching between the antenna 310 connected to the antenna terminal 81, the second switch 4, and the corresponding filters 32A to 32C.

For example, each of the three matching circuits 14A to 14C is configured to be a single inductor. However, each of the matching circuits 14A to 14C is not necessarily configured to be a single inductor and may include, for example, a plurality of inductors and a plurality of capacitors.

(1.2.10) Controller

The controller 15 is connected to the power amplifier 11. For example, the controller 15 is connected to the signal processing circuit 301 with the control terminal 84 interposed therebetween. The control terminal 84 is a terminal through which a control signal from an external circuit (for example, the signal processing circuit 301) is inputted to the controller 15. The controller 15 controls the power amplifier 11 in accordance with a control signal acquired from the control terminal 84. The controller 15 supports, for example, MIPI standards. The controller 15 controls the power amplifier 11 in accordance with a control signal from the RF signal processing circuit 302 of the signal processing circuit 301. The controller 15 acquires a control signal from the RF signal processing circuit 302, and operates the power amplifier 11 in, for example, the first power mode or the second power mode, in accordance with the control signal. In the case where a control signal from the RF signal processing circuit 302 is a signal indicating an operation of the power amplifier 11 in the first power mode, the controller 15 causes the power amplifier 11 to operate in the first power mode. In the case where a control signal from the RF signal processing circuit 302 is a signal indicating an operation of the power amplifier 11 in the second power mode, the controller 15 causes the power amplifier 11 to operate in the second power mode.

To cause the power amplifier 11 to perform an envelope tracking operation, the controller 15 controls the power supply voltage of the power amplifier 11 in accordance with the input signal level of a transmission signal inputted to the power amplifier 11 (a transmission signal from the signal processing circuit 301). More particularly, in the high frequency module 1, a first power supply voltage and a second power supply voltage that correspond to the amplitude level of a transmission signal are supplied to a first power supply terminal for the power supply to the driver-stage amplifier and a second power supply terminal for the power supply to the output-stage amplifier. For example, the controller 15 generates the first power supply voltage and the second power supply voltage on the basis of a power supply control signal (envelope signal) from the baseband signal processing circuit 303 of the signal processing circuit 301, and supplies the generated first power supply voltage and the generated second power supply voltage to the first power supply terminal and the second power supply terminal, respectively. The baseband signal processing circuit 303 detects the amplitude level of a modulation signal on the basis of an IQ signal, and outputs a power supply control signal to the controller 15 so that the levels of the first power supply voltage and the second power supply voltage correspond to the amplitude level of the transmission signal.

(1.2.11) Low Noise Amplifier

The low noise amplifier 21 includes the input terminal and the output terminal. The low noise amplifier 21 is provided at a signal path for a reception signal. The low noise amplifier 21 amplifies a reception signal of the predetermined frequency band inputted to the input terminal and outputs the amplified reception signal through the output terminal. The input terminal of the low noise amplifier 21 is connected to the third common terminal 60 of the third switch 6. The output terminal of the low noise amplifier 21 is connected to the signal output terminal 83. The output terminal of the low noise amplifier 21 is connected to, for example, the signal processing circuit 301 with the signal output terminal 83 interposed therebetween. The signal output terminal 83 is a terminal through which a high frequency signal (reception signal) from the low noise amplifier 21 is outputted to an external circuit (for example, the signal processing circuit 301).

(1.2.12) Input Matching Circuit

The input matching circuit 20 is provided at a signal path between the input terminal of the low noise amplifier 21 and the third common terminal 60 of the third switch 6. The input matching circuit 20 is a circuit for performing the impedance matching between the low noise amplifier 21 and each of the reception filters 22A to 22C. For example, the input matching circuit 20 is configured to be a single inductor. However, the input matching circuit 20 is not necessarily configured to be a single inductor and may include, for example, a plurality of inductors and a plurality of capacitors.

(1.2.13) Multiplexer

The multiplexer 3 includes the low pass filter 31A and a high pass filter 31B. In the multiplexer 3, the low pass filter 31A is provided between the antenna terminal 81 and the second common terminal 40 of the second switch 4.

(1.2.14) External Connection Terminal

The high frequency module 1 includes a plurality of external connection terminals 80. The plurality of external connection terminals 80 include the antenna terminal 81, the signal input terminal 82, the signal output terminal 83, the plurality of control terminals 84 and 85, the monitor output terminal 87, and a plurality of ground terminals 89 (see FIG. 2). The plurality of ground terminals 89 are terminals that are electrically connected to ground electrodes on the circuit substrate, which has been described above, in the communication apparatus 300 and are supplied with a ground potential.

(1.3) Structure of High Frequency Module

Hereinafter, a structure of the high frequency module 1 will be described with reference to FIG. 2.

The high frequency module 1 includes the power amplifier 11, the first switch 5, the second switch 4, and the antenna terminal 81. The high frequency module 1 further includes a mounting substrate 9.

The mounting substrate 9 has a first main face 91 and a second main face 92 that face each other in a thickness direction D1 of the mounting substrate 9. The mounting substrate 9 is, for example, a printed wiring board, an LTCC (Low Temperature Co-fired Ceramics) substrate, an HTCC (High Temperature Co-fired Ceramics) substrate, or a resin multilayer substrate. For example, the mounting substrate 9 is a multilayer substrate including a plurality of dielectric layers and a plurality of conductive layers. The plurality of dielectric layers and the plurality of conductive layers are laminated in the thickness direction D1 of the mounting substrate 9. The plurality of conductive layers are formed in predetermined patterns set for the individual layers. Each of the plurality of conductive layers includes one or more conductive parts on a plane perpendicular to the thickness direction D1 of the mounting substrate 9. Each of the conductive layers is made of, for example, copper. The plurality of conductive layers include a ground layer. In the high frequency module 1, the plurality of ground terminals 89 are electrically connected to the ground layer with a via conductor or the like in the mounting substrate 9 interposed therebetween.

The mounting substrate 9 is not necessarily a printed wiring board or an LTCC substrate and may be a wiring structure. The wiring structure is, for example, a multilayer structure. The multilayer structure includes at least one insulating layer and at least one conductive layer. An insulating layer is formed in a predetermined pattern. In the case where a plurality of insulating layers are provided, the plurality of insulating layers are formed in predetermined patterns set for the individual layers. A conductive layer is formed in a predetermined pattern different from the predetermined pattern of the insulating layer. In the case where a plurality of conductive layers are provided, the plurality of conductive layers are formed in predetermined patterns set for the individual layers. A conductive layer may include one or more rewiring part. In the wiring structure, a first face, out of two faces that face each other in the thickness direction of the multilayer structure, is the first main face 91 of the mounting substrate 9, and a second face out of the two faces is the second main face 92. The wiring structure may be, for example, an interposer. The interposer may include a silicon substrate or may include a substrate including multiple layers.

The first main face 91 and the second main face 92 of the mounting substrate 9 are separated from each other in the thickness direction D1 of the mounting substrate 9 and intersect in the thickness direction D1 of the mounting substrate 9. For example, the first main face 91 of the mounting substrate 9 is perpendicular to the thickness direction D1 of the mounting substrate 9. However, for example, the first main face 91 of the mounting substrate 9 may have a side face or the like of a conductive part as a face not perpendicular to the thickness direction D1. Furthermore, for example, the second main face 92 of the mounting substrate 9 is perpendicular to the thickness direction D1 of the mounting substrate 9. However, for example, the second main face 92 of the mounting substrate 9 may have a side face or the like of a conductive part as a face not perpendicular to the thickness direction D1. Furthermore, fine projections and recesses, recesses, or projections may be formed in the first main face 91 and the second main face 92 of the mounting substrate 9. The mounting substrate 9 has a rectangular shape when viewed in plan from the thickness direction D1 of the mounting substrate 9. However, the mounting substrate 9 does not necessarily have a rectangular shape and may have a square shape.

The high frequency module 1 includes, as a plurality of circuit elements, the power amplifier 11, the first switch 5, the second switch 4, the controller 15, the low noise amplifier 21, the three filters 32A to 32C, the third switch 6, the fourth switch 17, the coupler 16, the output matching circuit 13, the input matching circuit 20, the three matching circuits 14A to 14C, and the multiplexer 3, as described above. The plurality of circuit elements of the high frequency module 1 is mounted at the mounting substrate 9. A state in which a circuit element is mounted at the mounting substrate 9 includes a state in which the circuit element is arranged at (mechanically connected to) the mounting substrate 9 and a state in which the circuit element is electrically connected to (an appropriate conductive part of) the mounting substrate 9. The plurality of circuit elements are not limited to electronic components mounted at the mounting substrate 9 and may include circuit elements provided in the mounting substrate 9.

In the high frequency module 1, the power amplifier 11 is mounted on the first main face 91 of the mounting substrate 9. Thus, the power amplifier 11 is arranged on the first main face 91 of the mounting substrate 9. Furthermore, in the high frequency module 1, the first switch 5 is mounted on the first main face 91 of the mounting substrate 9. Thus, the first switch 5 is arranged on the first main face 91 of the mounting substrate 9. The second switch 4 is mounted on the second main face 92 of the mounting substrate 9. Thus, the second switch 4 is arranged on the second main face 92 of the mounting substrate 9.

Furthermore, in the high frequency module 1, the controller 15, the output matching circuit 13, the three filters 32A to 32C, and the three matching circuits 14A to 14C are arranged on the first main face 91 of the mounting substrate 9. Thus, in the high frequency module 1, the controller 15, the output matching circuit 13, the three filters 32A to 32C, and the three matching circuits 14A to 14C are arranged on the first main face 91 of the mounting substrate 9. Furthermore, in the high frequency module 1, the coupler 16, the multiplexer 3, the input matching circuit 20, the low noise amplifier 21, the third switch 6, and the fourth switch 17 are mounted on the second main face 92 of the mounting substrate 9. Thus, in the high frequency module 1, the coupler 16, the multiplexer 3, the input matching circuit 20, the low noise amplifier 21, the third switch 6, and the fourth switch 17 are arranged on the second main face 92 of the mounting substrate 9.

Figure 2:
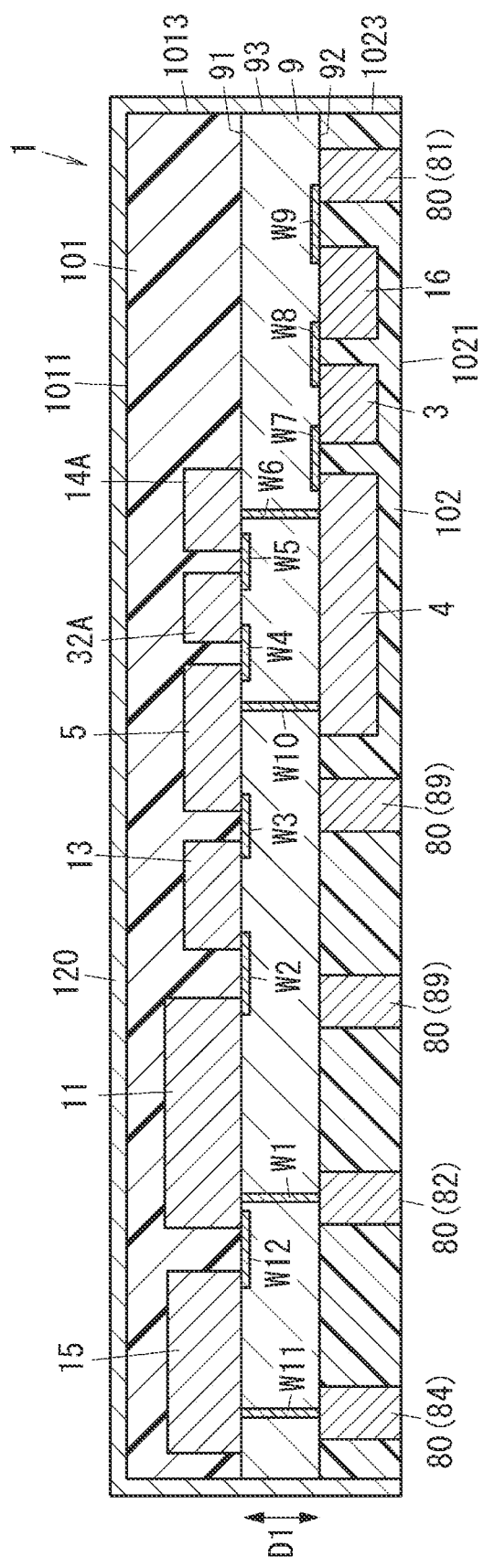
FIG. 2 is a cross-section diagram of the high frequency module.

In FIG. 2, twelve wirings W1 to W12 among a plurality of wirings configured to be a conductive part, a via conductor, and the like of the mounting substrate 9 described above are illustrated. The wirings W1 to W12 are also illustrated with signs in FIG. 1. The wiring W1 is a wiring for connecting the signal input terminal 82 to the input terminal of the power amplifier 11. The wiring W2 is a wiring for connecting the output terminal of the power amplifier 11 to the output matching circuit 13. The wiring W3 is a wiring for connecting the output matching circuit 13 to the first common terminal 50 of the first switch 5. The wiring W4 is a wiring for connecting the first selection terminal 51 of the first switch 5 to the filter 32A. The wiring W5 is a wiring for connecting the filter 32A to the matching circuit 14A. The wiring W6 is a wiring for connecting the matching circuit 14A to the second selection terminal 41 of the second switch 4. The wiring W7 is a wiring for connecting the second common terminal 40 of the second switch 4 to the multiplexer 3. The wiring W8 is a wiring for connecting the multiplexer 3 to the coupler 16. The wiring W9 is a wiring for connecting the coupler 16 to the antenna terminal 81. The wiring W10 is a wiring for connecting the first selection terminal 54 of the first switch 5 to the second selection terminal 44 of the second switch 4. The wiring W11 is a wiring for connecting the control terminal 84 to the controller 15. The wiring W12 is a wiring for connecting the controller 15 to the power amplifier 11.

The power amplifier 11 is, for example, a GaAs IC chip including an power amplifying circuit including an HBT (Heterojunction Bipolar Transistor) as a bipolar transistor. The power amplifying circuit includes the driver-stage amplification circuit, the output-stage amplification circuit, and the inter-stage amplification circuit described above. The power amplifier 11 is flip-chip mounted on the mounting substrate 9. The outer peripheral shape of the power amplifier 11 when viewed in plan from the thickness direction D1 of the mounting substrate 9 is a quadrangular shape. The power amplifier 11 is not limited to a GaAs IC chip and may be, for example, an Si IC chip including a power amplifying circuit or an SiGe IC chip including a power amplifying circuit.

A switch IC configuring the first switch 5 is a single-chip IC chip. The first switch 5 includes the first common terminal 50, the four first selection terminals 51 to 54, and a plurality of FETs (Field Effect Transistors). The first switch 5 is flip-chip mounted on the first main face 91 of the mounting substrate 9. The outer peripheral shape of the first switch 5 when viewed in plan from the thickness direction D1 of the mounting substrate 9 is a quadrangular shape.

A switch IC configuring the second switch 4 is a single-chip IC chip. The second switch 4 includes the second common terminal 40, the four second selection terminals 41 to 44, and a plurality of FETs. The second switch 4 is flip-chip mounted on the second main face 92 of the mounting substrate 9. The outer peripheral shape of the second switch 4 when viewed in plan from the thickness direction D1 of the mounting substrate 9 is a quadrangular shape.

A switch IC configuring the third switch 6 is a single-chip IC chip. The third switch 6 includes the third common terminal 60, the three third selection terminals 61 to 63, and a plurality of FETs. The third switch 6 is flip-chip mounted on the second main face 92 of the mounting substrate 9. The outer peripheral shape of the third switch 6 when viewed in plan from the thickness direction D1 of the mounting substrate 9 is a quadrangular shape.

A switch IC configuring the fourth switch 17 is a single-chip IC chip. The fourth switch 17 is flip-chip mounted on the second main face 92 of the mounting substrate 9. The outer peripheral shape of the fourth switch 17 when viewed in plan from the thickness direction D1 of the mounting substrate 9 is a quadrangular shape.

Each of the three filters 32A to 32C is, for example, a single-chip electronic component. As described above, the filter 32A includes the transmission filter 12A and the reception filter 22A. The filter 32B includes the transmission filter 12B and the reception filter 22B. The filter 32C includes the transmission filter 12C and the reception filter 22C.

Each of the three transmission filters 12A to 12C and the three reception filters 22A to 22C is, for example, a ladder filter and includes a plurality of (for example, four) series-arm resonators and a plurality of (for example, three) parallel-arm resonators. Each of the three transmission filters 12A to 12C and the three reception filters 22A to 22C is, for example, an acoustic wave filter. Each of the plurality of series-arm resonators and the plurality of parallel-arm resonators is an acoustic wave resonator. The acoustic wave filter is, for example, a surface acoustic wave filter using surface acoustic waves.

In the surface acoustic wave filter, each of the plurality of series-arm resonators and the plurality of parallel-arm resonators is, for example, a SAW (Surface Acoustic Wave) resonator.

Each of the three filters 32A to 32C includes, for example, a substrate having a first main face and a second main face, a first circuit part as a transmission filter formed on the first main face side of the substrate, and a second circuit part as a reception filter formed on the first main face side of the substrate. The substrate is, for example, a piezoelectric substrate. The piezoelectric substrate is, for example, a lithium tantalate substrate, a lithium niobate substrate, or the like. The first circuit part and the second circuit part each include a plurality of IDT (Interdigital Transducer) electrodes associated with the plurality of series-arm resonators in a one-to-one relationship and a plurality of IDT electrodes associated with the plurality of parallel-arm resonators in the one-to-one relationship.

The three filters 32A to 32C are mounted on the first main face 91 of the mounting substrate 9. The three filters 32A to 32C are arranged in such a manner that the first main face out of the first main face and the second main face of the substrate is on the mounting substrate 9 side. The outer peripheral shape of each of the three filters 32A to 32C when viewed in plan from the thickness direction D1 of the mounting substrate 9 is a quadrangular shape.

The substrate of each of the three filters 32A to 32C is not limited to a piezoelectric substrate and may be, for example, a silicon substrate. In this case, each of the three filters 32A to 32C includes a low acoustic velocity film provided on the first main face of the substrate and a piezoelectric layer provided on the low acoustic velocity film. The plurality of IDT electrodes are provided on the piezoelectric layer. The low acoustic velocity film is provided directly or indirectly on the substrate. Furthermore, the piezoelectric layer is provided directly or indirectly on the low acoustic velocity film. The acoustic velocity of bulk waves propagating in the low acoustic velocity film is lower than the acoustic velocity of bulk waves propagating in the piezoelectric layer. The piezoelectric layer is made of, for example, lithium tantalate. The low acoustic velocity film is made of, for example, silicon oxide. The thickness of the piezoelectric layer is, for example, $3.5\lambda$ or less, where the wavelength of an acoustic wave defined by an electrode finger period of an IDT electrode is represented by $\lambda$. The thickness of the low acoustic velocity film is, for example, $2.0\lambda$ or less.

The piezoelectric layer may be formed of, for example, lithium tantalate, lithium niobate, zinc oxide, aluminum nitride, or PZT. Furthermore, the low acoustic velocity film may include at least one type of material selected from a group composed of silicon oxide, glass, silicon oxynitride, tantalum oxide, and a compound obtained by adding fluorine, carbon, or boron to silicon oxide. Furthermore, the substrate may include at least one type of material selected from a group composed of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

Each of the three filters 32A to 32C may include, for example, a close contact layer interposed between the low acoustic velocity film and the piezoelectric layer. The close contact layer is made of, for example, resin (epoxy resin or polyimide resin). Furthermore, each of the three filters 32A to 32C may include a dielectric film between the low acoustic velocity film and the piezoelectric layer, above the piezoelectric layer, or below the low acoustic velocity film.

Furthermore, each of the three filters 32A to 32C may include, for example, a high acoustic velocity film interposed between the substrate and the low acoustic velocity film. The high acoustic velocity film is provided directly or indirectly on the substrate. The low acoustic velocity film is provided directly or indirectly on the high acoustic velocity film. The piezoelectric layer is provided directly or indirectly on the low acoustic velocity film. The acoustic velocity of bulk waves propagating in the high acoustic velocity film is higher than the acoustic velocity of acoustic waves propagating in the piezoelectric layer. The acoustic velocity of bulk waves propagating in the low acoustic velocity film is lower than the acoustic velocity of bulk waves propagating in the piezoelectric layer.

The high acoustic velocity film is made of diamond-like carbon, aluminum nitride, aluminum oxide, silicon carbide, silicon nitride, silicone, sapphire, lithium tantalate, lithium niobate, a piezoelectric body such as quartz, ceramics such as alumina, zirconia, cordierite, mullite, steatite, or forsterite, magnesia, diamond, a material having a material mentioned above as a main component, or a material having a mixture of materials mentioned above as a main component.

Regarding the thickness of a high acoustic velocity film, a larger thickness is desirable because the high acoustic velocity film has a function for confining acoustic waves in the piezoelectric layer and the low acoustic velocity film.

Each of the three filters 32A to 32C may further include, for example, a spacer layer and a cover member. The spacer layer and the cover member are provided on the first main face side of the substrate. The spacer layer surrounds the plurality of IDT electrodes when the spacer layer is viewed in plan from the thickness direction D1 of the mounting substrate 9. The spacer layer has a frame shape (rectangular frame shape) when viewed in plan from the thickness direction D1 of the mounting substrate 9. The spacer layer has electrical insulation characteristics. The spacer layer is made of, for example, epoxy resin or a synthetic resin such as polyimide. The cover member has a flat plate shape. The cover member has a rectangular shape when viewed in plan from the thickness direction D1 of the mounting substrate 9. However, the cover member does not necessarily have a rectangular shape and may have a square shape. In each of the three filters 32A to 32C, the outer shape size of the cover member and the outer shape size of the spacer layer are substantially the same when the filter is viewed in plan from the thickness direction D1 of the mounting substrate 9. The cover member is arranged at the spacer layer such that the cover member faces the substrate in the thickness direction D1 of the mounting substrate 9. The cover member overlaps with the plurality of IDT electrodes in the thickness direction D1 of the mounting substrate 9 and is separated from the plurality of IDT electrodes in the thickness direction D1 of the mounting substrate 9. The cover member has electrical insulation characteristics. The cover member is made of, for example, epoxy resin or a synthesis resin such as polyimide. Each of the three filters 32A to 32C has a space surrounded by the substrate, the spacer layer, and the cover member. In each of the three filters 32A to 32C, the space is filled with gas. The gas is, for example, air, inert gas (for example, nitrogen gas), or the like. A plurality of terminals in each of the three filters 32A to 32C are exposed out of the cover member. The plurality of terminals are, for example, bumps. The bumps are, for example, solder bumps. The bumps are not necessarily solder bumps and may be, for example, gold bumps.

The controller 15 is a single-chip IC chip. The controller 15 is flip-chip mounted on the first main face 91 of the mounting substrate 9. The outer peripheral shape of the controller 15 when viewed in plan from the thickness direction D1 of the mounting substrate 9 is a quadrangular shape.

A circuit element configuring the output matching circuit 13 is, for example, a chip inductor. The circuit element of the output matching circuit 13 is mounted on, for example, the first main face 91 of the mounting substrate 9. However, the circuit element of the output matching circuit 13 is not necessarily mounted on the first main face 91 of the mounting substrate 9. The outer peripheral shape of the circuit element when viewed in plan from the thickness direction D1 of the mounting substrate 9 is a quadrangular shape.

A circuit element configuring the input matching circuit 20 is, for example, a chip inductor. The circuit element of the input matching circuit 20 is mounted on, for example, the first main face 91 of the mounting substrate 9. However, the circuit element of the input matching circuit 20 is not necessarily mounted on the first main face 91 of the mounting substrate 9. The outer peripheral shape of the circuit element when viewed in plan from the thickness direction D1 of the mounting substrate 9 is a quadrangular shape.

A circuit element of each of the three matching circuits 14A to 14C is, for example, a chip inductor. The circuit element of each of the three matching circuits 14A to 14C is mounted on, for example, the first main face 91 of the mounting substrate 9. However, the circuit element of each of the matching circuits 14A to 14C is not necessarily mounted on the first main face 91 of the mounting substrate 9. The outer peripheral shape of the circuit element when viewed in plan from the thickness direction D1 of the mounting substrate 9 is a quadrangular shape.

The low noise amplifier 21 is a single-chip IC chip. The low noise amplifier 21 is flip-chip mounted on the second main face 92 of the mounting substrate 9. The low noise amplifier 21 is arranged so as not to overlap with the power amplifier 11 when the low noise amplifier 21 is viewed in plan from the thickness direction D1 of the mounting substrate 9. The outer peripheral shape of the low noise amplifier 21 when viewed in plan from the thickness direction D1 of the mounting substrate 9 is a quadrangular shape.

The multiplexer 3 is mounted on the second main face 92 of the mounting substrate 9. Thus, the multiplexer 3 is arranged on the second main face 92 of the mounting substrate 9. The low pass filter 31A of the multiplexer 3 includes, for example, a plurality of inductors and capacitors. Furthermore, the high pass filter 31B of the multiplexer 3 includes, for example, a plurality of inductors and capacitors. The multiplexer 3 may be an IPD (Integrated Passive Device).

The coupler 16 is mounted on the second main face 92 of the mounting substrate 9. Thus, the coupler 16 is arranged on the second main face 92 of the mounting substrate 9.

The plurality of external connection terminals 80 are arranged on the second main face 92 of the mounting substrate 9. The plurality of external connection terminals 80 are made of, for example, metal (for example, copper, copper alloy, etc.). Each of the plurality of external connection terminals 80 is a column-shaped electrode. A column-shaped electrode is, for example, an electrode of a cylindrical shape. The plurality of external connection terminals 80 may have the same shapes or different shapes.

The plurality of external connection terminals 80 include, as described above, the antenna terminal 81, the signal input terminal 82, the signal output terminal 83, the control terminals 84 and 85, the terminal 86, the monitor output terminal 87, and the plurality of ground terminals 89. The plurality of ground terminals 89 are electrically connected to the ground layer of the mounting substrate 9, as described above. The ground layer is a circuit ground of the high frequency module 1, and the plurality of circuit elements of the high frequency module 1 include a circuit element electrically connected to the ground layer.

The high frequency module 1 further includes a first resin layer 101. On the first main face 91 side of the mounting substrate 9, the first resin layer 101 covers a plurality of circuit elements mounted on the first main face 91 of the mounting substrate 9. The plurality of circuit elements include the power amplifier 11, the first switch 5, the three filters 32A to 32C, the output matching circuit 13, and the controller 15. The first resin layer 101 contains resin. The first resin layer 101 may contain a filler in addition to the resin.

The high frequency module 1 further includes a second resin layer 102. On the second main face 92 side of the mounting substrate 9, the second resin layer 102 covers part of a plurality of circuit elements and part of the plurality of external connection terminals 80 that are mounted on the second main face 92 of the mounting substrate 9. The plurality of circuit elements include the second switch 4, the multiplexer 3, the coupler 16, and the low noise amplifier 21. The second resin layer 102 is formed such that tip end faces of the plurality of external connection terminals 80 are exposed. The second resin layer 102 contains resin. The second resin layer 102 may contain a filler in addition to the resin. The second resin layer 102 may be made of the same material as the material of the first resin layer 101 or the second resin layer 102 may be made of a material different from the material of the first resin layer 101.

The high frequency module 1 further includes a shield layer 120. The shield layer 120 is made of, for example, metal. The shield layer 120 covers a main face 1011 and an outer peripheral face 1013 of the first resin layer 101, an outer peripheral face 93 of the mounting substrate 9, and an outer peripheral face 1023 of the second resin layer 102. The shield layer 120 is in contact with the ground layer of the mounting substrate 9. Accordingly, in the high frequency module 1, the potential of the shield layer 120 is the same as the potential of the ground layer.

In the high frequency module 1, the first switch 5 and the second switch 4 partially overlap when the high frequency module 1 is viewed in plan from the thickness direction D1 of the mounting substrate 9. However, the first switch 5 and the second switch 4 do not necessarily overlap partially and may, for example, overlap entirely. In the high frequency module 1, the first selection terminal 54 of the first switch 5 (see FIG. 1) and the second selection terminal 44 of the second switch 4 (see FIG. 1) are connected by the wiring W10 that is arranged along the thickness direction D1 of the mounting substrate 9. The wiring W10 has a straight line shape along the thickness direction D1 of the mounting substrate 9. In the high frequency module 1, the wiring W10 overlaps with both the first switch 5 and the second switch 4 when viewed in plan from the thickness direction D1 of the mounting substrate 9. The wiring W10 configures a bypass path that connects the first selection terminal 54 of the first switch 5 to the second selection terminal 44 of the second switch 4 without other circuit elements interposed therebetween. In short, the wiring W10 connects the first selection terminal 54 of the first switch 5 to the second selection terminal 44 of the second switch 4 without any of the plurality of filters 32A to 32C and the plurality of matching circuits 14A to 14C interposed therebetween.

In the high frequency module 1, each of the plurality of filters 32A and the second switch 4 overlap when viewed in plan from the thickness direction D1 of the mounting substrate 9. Furthermore, in the high frequency module 1, each of the plurality of matching circuits 14A to 14C and the second switch 4 partially overlap when viewed in plan from the thickness direction D1 of the mounting substrate 9.

(2) Conclusion (2.1) High Frequency Module

The high frequency module 1 according to the first embodiment includes the power amplifier 11, the first switch 5, the three filters 32A to 32C, the second switch 4, and the antenna terminal 81. The power amplifier 11 is capable of operating in the first power mode and the second power mode with a gain lower than the gain of the first power mode. The first switch 5 includes the first common terminal 50 and the four first selection terminals 51 to 54, and the power amplifier 11 is connected to the first common terminal 50. The three filters 32A to 32C are connected to the three first selection terminals 51 to 53 other than the first selection terminal 54 among the four first selection terminals 51 to 54 of the second switch 4. The second switch 4 includes the second common terminal 40 and the four second selection terminals 41 to 44, and the three filters 32A to 32C are connected to the three second selection terminals 41 to 43 other than the second selection terminal 44 among the four second selection terminals 41 to 44. The antenna terminal 81 is connected to the second common terminal 40. The first selection terminal 54 of the first switch 5 and the second selection terminal 44 of the second switch 4 are connected. The first switch 5 is capable of switching between a first path passing through at least one of the three filters 32A to 32C and a second path not passing through any of the three filters 32A to 32C but passing through the first selection terminal 54.

In the high frequency module 1 according to the first embodiment, a reduction of the current consumption can be achieved. In the high frequency module 1 according to the first embodiment, for example, when the power amplifier 11 operates in the first power mode, the first common terminal 50 of the first switch 5 can be connected to at least one of the three first selection terminals 51 to 53 other than the first selection terminal 54 among the four first selection terminals 51 to 54. Furthermore, in the high frequency module 1 according to the first embodiment, for example, when the power amplifier 11 operates in the second power mode, the first common terminal 50 of the first switch 5 can be connected to the first selection terminal 54. Thus, in the high frequency module 1 according to the first embodiment, when the power amplifier 11 operates in the second power mode, none of the three filters 32A to 32C are passed through. Therefore, the loss can be reduced, and the current consumption can be reduced. Since the power amplifier 11 has a low gain in the second power mode, the noise level is low, and excellent linearity can be achieved.

The high frequency module 1 according to the first embodiment further includes the mounting substrate 9 having the first main face 91 and the second main face 92 that face each other. In the high frequency module 1 according to the first embodiment, the first switch 5 is arranged on the first main face 91 of the mounting substrate 9, and the second switch 4 is arranged on the second main face 92 of the mounting substrate 9. In the high frequency module 1 according to the first embodiment, the first switch 5 and the second switch 4 at least partially overlap when viewed in plan from the thickness direction D1 of the mounting substrate 9. Accordingly, in the high frequency module 1 according to the first embodiment, the length of the wiring (length of the wiring W10) between the first selection terminal 54 of the first switch 5 and the second selection terminal 44 of the second switch 4 can be shortened, the loss can further be reduced, and the current consumption can further be reduced.

(2.2) Communication Apparatus

The communication apparatus 300 according to the first embodiment includes the high frequency module 1 and the signal processing circuit 301. The signal processing circuit 301 performs signal processing on a transmission signal. The high frequency module 1 amplifies a transmission signal from the signal processing circuit 301 and outputs the amplified transmission signal. The high frequency module 1 transfers a transmission signal between the antenna 310 and the signal processing circuit 301.

Since the communication apparatus 300 according to the first embodiment includes the high frequency module 1, a reduction of the current consumption can be achieved. A plurality of electronic components configuring the signal processing circuit 301 may be, for example, mounted on the circuit substrate described above or mounted on a circuit substrate (second circuit substrate) different from the circuit substrate (first circuit substrate) on which the high frequency module 1 is mounted.

(3) Modification of High Frequency Module (3.1) First Modification

Figure 3:
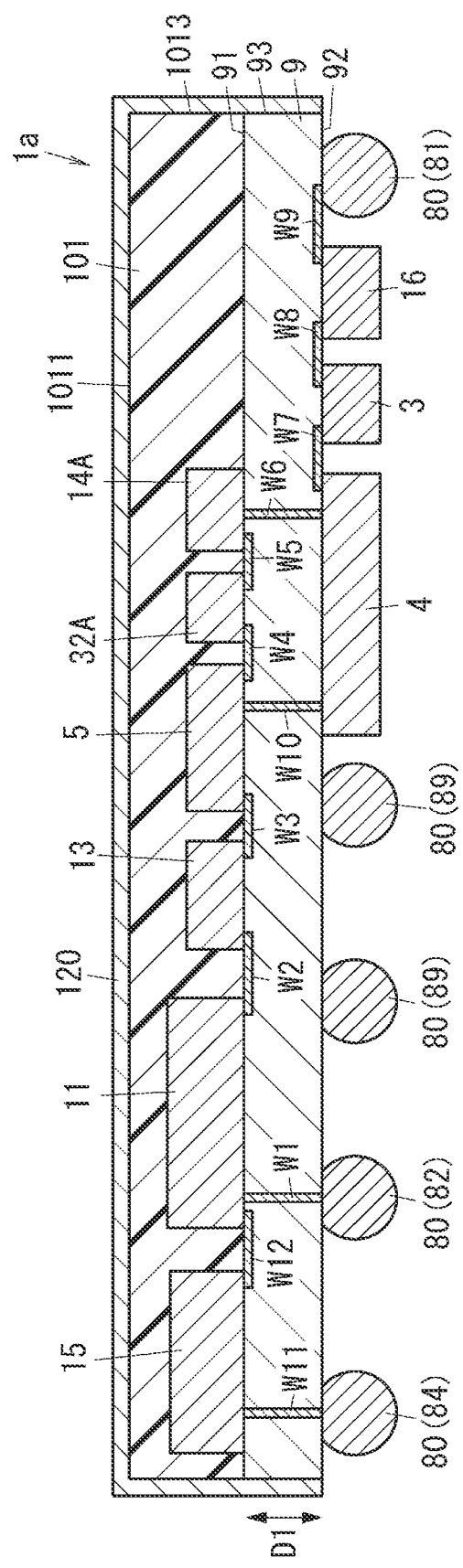
FIG. 3 is a cross-section diagram of a high frequency module according to a first modification of the first embodiment.

A high frequency module 1a according to a first modification of the first embodiment will be described with reference to FIG. 3. Components of the high frequency module 1a according to the first modification similar to those of the high frequency module 1 according to the first embodiment will be referred to with the same signs and explanation for those similar components will be omitted.

The high frequency module 1a according to the first modification is different from the high frequency module 1 according to the first embodiment in that the plurality of external connection terminals 80 are ball bumps. The high frequency module 1a according to the first modification is also different from the high frequency module 1 according to the first embodiment in that the high frequency module 1a does not include the second resin layer 102 of the high frequency module 1 according to the first embodiment. The high frequency module 1a according to the first modification may include under fill parts each provided between the second switch 4 and the second main face 92 of the mounting substrate 9 and between the low noise amplifier 21 and the second main face 92 of the mounting substrate 9.

The ball bumps configuring the plurality of external connection terminals 80 are made of, for example, gold, copper, solder, or the like.

The plurality of external connection terminals 80 may be a mixture of an external connection terminal(s) 80 formed of a ball bump(s) and an external connection terminal(s) 80 formed of a column-shaped electrode(s).

As in the high frequency module 1 according to the first embodiment, in the high frequency module 1a according to the first modification, the first selection terminal 54 of the first switch 5 and the second selection terminal 44 of the second switch 4 are connected. Thus, a reduction of the current consumption can be achieved.

(3.2) Second Modification

Figure 4:
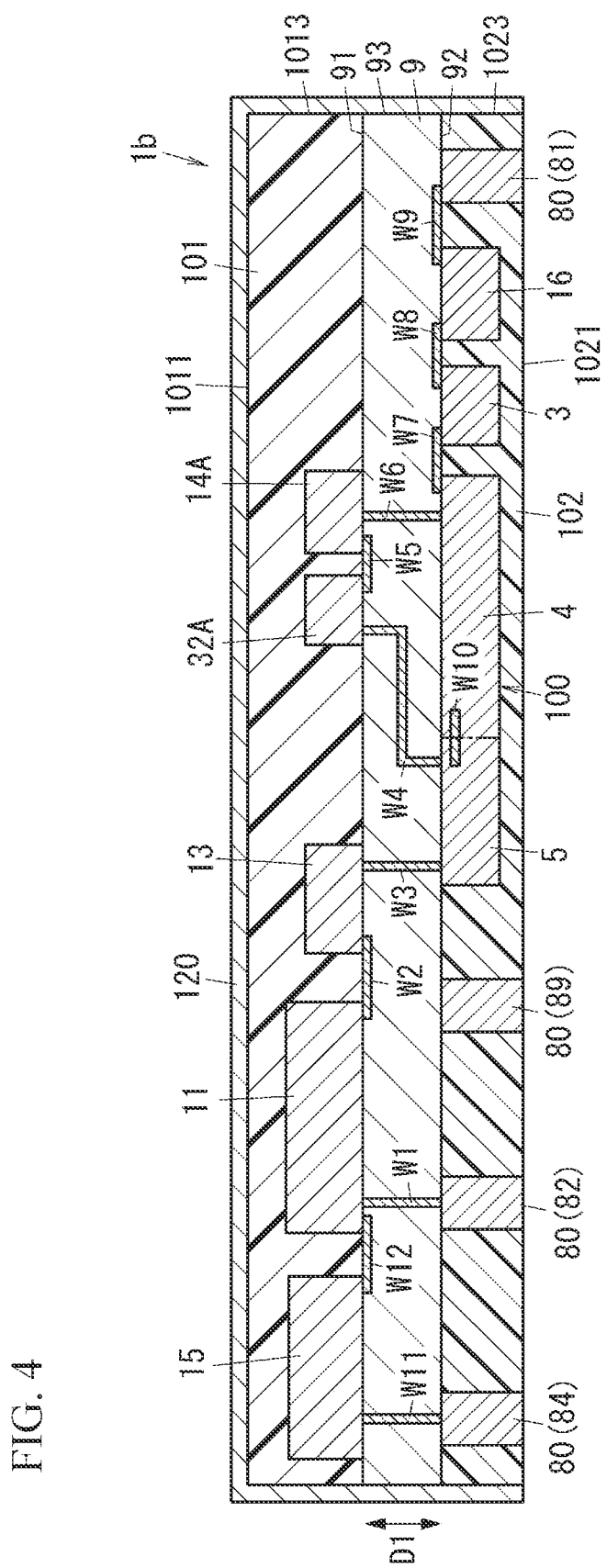
FIG. 4 is a cross-section diagram of a high frequency module according to a second modification of the first embodiment.

A high frequency module 1b according to a second modification of the first embodiment will be described with reference to FIG. 4. Components of the high frequency module 1b according to the second modification similar to those of the high frequency module 1 according to the first embodiment will be referred to with the same signs, and explanation for the similar components will be omitted.

The high frequency module 1b according to the second modification is different from the high frequency module 1 according to the first embodiment in that the first switch 5 is arranged on the second main face 92 of the mounting substrate 9. In the high frequency module 1b according to the second modification, the first switch 5 and the second switch 4 are integrated into a single chip. In other words, the high frequency module 1b includes an IC chip 100 including the first switch 5 and the second switch 4. In the high frequency module 1b, the IC chip 100 includes the wiring W10 that connects the first selection terminal 54 of the first switch 5 (see FIG. 1) to the second selection terminal 44 of the second switch 4 (see FIG. 1).

As in the high frequency module 1 according to the first embodiment, in the high frequency module 1b according to the second modification, the first selection terminal 54 of the first switch 5 and the second selection terminal 44 of the second switch 4 are connected. Thus, a reduction of the current consumption can be achieved. Furthermore, compared to the high frequency module 1 according to the first embodiment, the length of the wiring W10 in the high frequency module 1b according to the second modification can be shortened. Thus, the loss can further be reduced, and the current consumption can further be reduced.

In the high frequency module 1b according to the second modification, the IC chip 100 as a single chip including the first switch 5 and the second switch 4 may include the low noise amplifier 21 (see FIG. 1).

(3.3) Third Modification

Figure 5:
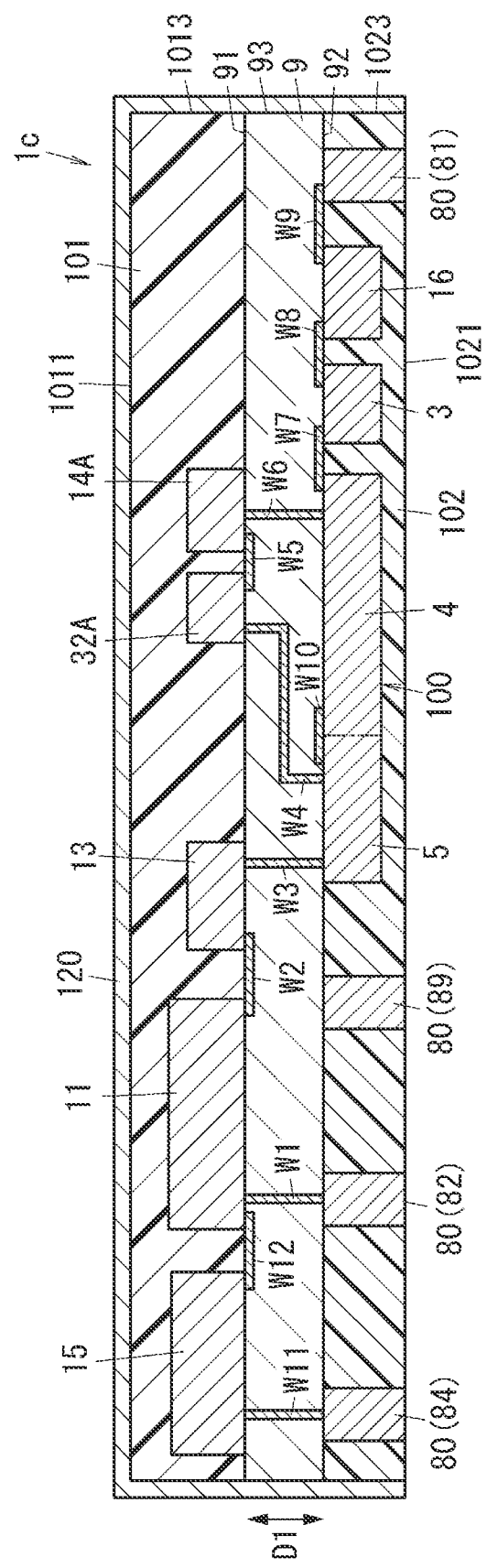
FIG. 5 is a cross-section diagram of a high frequency module according to a third modification of the first embodiment.

A high frequency module 1c according to a third modification of the first embodiment will be described with reference to FIG. 5. Components of the high frequency module 1c according to the third modification similar to those of the high frequency module 1b according to the second modification will be referred to with the same signs and explanation for those similar components will be omitted.

The high frequency module 1c according to the third modification is different from the high frequency module 1b according to the second modification in that the wiring W10 that connects the first selection terminal 54 of the first switch 5 (see FIG. 1) to the second selection terminal 44 of the second switch 4 (see FIG. 1) is not included in the IC chip 100 but is included in the mounting substrate 9.

As in the high frequency module 1 according to the first embodiment, in the high frequency module 1c according to the third modification, the first selection terminal 54 of the first switch 5 and the second selection terminal 44 of the second switch 4 are connected. Thus, a reduction of the current consumption can be achieved.

(3.4) Fourth Modification

Figure 6:
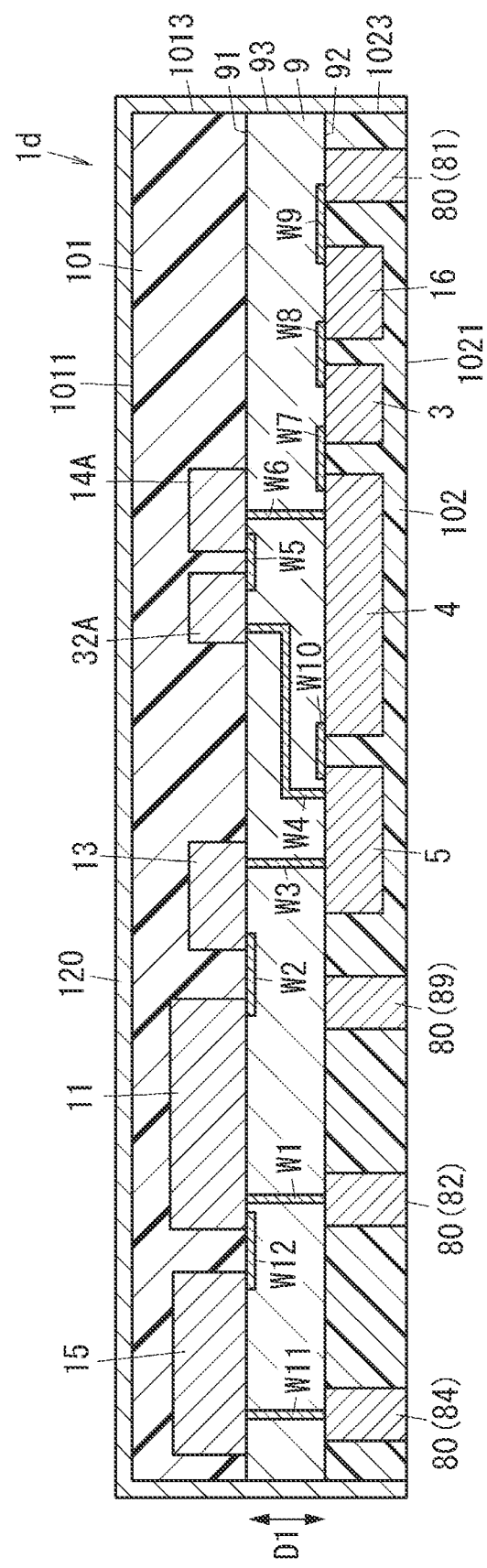
FIG. 6 is a cross-section diagram of a high frequency module according to a fourth modification of the first embodiment.

A high frequency module 1d according to a fourth modification of the first embodiment will be described with reference to FIG. 6. Components of the high frequency module 1d according to the fourth embodiment similar to those of the high frequency module 1c according to the third modification will be referred to with the same signs and explanation for those similar components will be omitted.

The high frequency module 1d according to the fourth modification is different from the high frequency module 1c according to the third modification in that the first switch 5 and the second switch 4 are adjacent to each other when viewed in plan from the thickness direction D1 of the mounting substrate 9. The state in which the first switch 5 and the second switch 4 are adjacent to each other represents a state in which the first switch 5 and the second switch 4 are adjacent to each other in such a manner that no other circuit elements are arranged in a straight line connecting the first switch 5 to the second switch 4 on the second main face 92 of the mounting substrate 9.

As in the high frequency module 1 according to the first embodiment, in the high frequency module 1d according to the fourth modification, the first selection terminal 54 of the first switch 5 and the second selection terminal 44 of the second switch 4 are connected. Thus, a reduction of the current consumption can be achieved. Furthermore, compared to the high frequency module 1 according to the first embodiment, the length of the wiring W10 in the high frequency module 1d according to the fourth modification can be shortened. Thus, the loss can further be reduced, and the current consumption can further be reduced.

Second Embodiment

Figure 7:
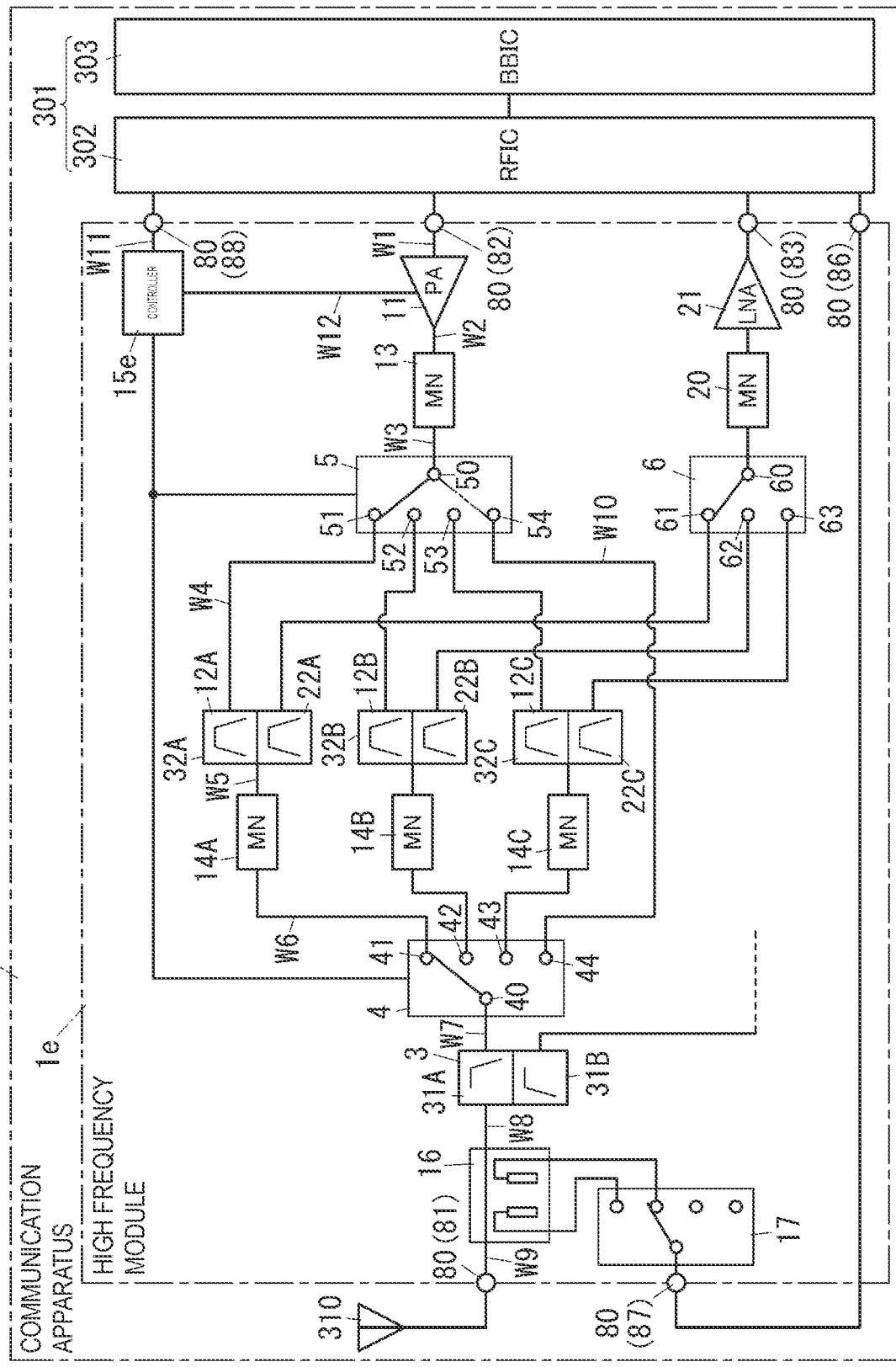
FIG. 7 is a circuit diagram of a high frequency module and a communication apparatus including the high frequency module according to a second embodiment.

A high frequency module 1e and a communication apparatus 300e according to a second embodiment will be described with reference to FIG. 7. Components of the high frequency module 1b and the communication apparatus 300e according to the second embodiment similar to those of the high frequency module 1 and the communication apparatus 300e according to the first embodiment will be referred to with the same signs and explanation for those similar components will be omitted.

The high frequency module 1e and the communication apparatus 300e according to the second embodiment are different from the high frequency module 1 and the communication apparatus 300 according to the first embodiment in that, instead of the controller 15 in the high frequency module 1 according to the first embodiment, a controller 15e is provided.

The controller 15e controls the power amplifier 11. The controller 15e also controls the first switch 5 and the second switch 4. The controller 15e is connected to the first switch 5 and the second switch 4 as well as to the power amplifier 11. The controller 15e controls the power amplifier 11, the first switch 5, and the second switch 4 in accordance with a control signal from an external circuit (signal processing circuit 301). The first switch 5 and the second switch 4 are, for example, switch ICs supporting GPIO (General Purpose Input/Output).

The first switch 5 performs switching of the state of the connection between the first common terminal 50 and each of the four first selection terminals 51 to 54 in accordance with a control signal from the controller 15e. Furthermore, the second switch 4 performs switching of the state of the connection between the second common terminal 40 and each of the four second selection terminals 41 to 44 in accordance with a control signal from the controller 15e.

As in the high frequency module 1 according to the first embodiment, in the high frequency module 1e according to the second embodiment, the first selection terminal 54 of the first switch 5 and the second selection terminal 44 of the second switch 4 are connected. Thus, a reduction of the current consumption can be achieved. The structure of the high frequency module 1e according to the second embodiment may be similar to the structure of any of the high frequency modules 1, 1a, 1b, 1c, and 1d.

(Other Modifications)

The first to second embodiments described above are merely embodiments among various embodiments of the present disclosure. Various changes may be made to the first to second embodiments described above in accordance with design and the like as long as an object of the present disclosure can be attained.

For example, the mounting substrate 9 may be a substrate including built-in components.

Instead of being flip-chip mounted on the first main face 91 of the mounting substrate 9, the power amplifier 11 may be mounted on the first main face 91 of the mounting substrate 9 in a mode using a bonding wire. That is, the power amplifier 11 may be arranged on (mechanically connected to) the first main face 91 of the mounting substrate 9 by being bonded to the first main face 91 of the mounting substrate 9 by a die-bonding material, and a terminal (pad electrode) may be electrically connected to a conductive part of a conductive pattern layer on the first main face 91 side of the mounting substrate 9 through a bonding wire.

Furthermore, in the high frequency modules 1, 1b, 1c, and 1d, the main face of a circuit element, which is arranged on the second main face 92 of the mounting substrate 9, opposite to the mounting substrate 9 side may be exposed out of the second resin layer 102.

Furthermore, at least one of the plurality of filters 32A to 32C may be a duplexer used for the communication supporting TDD (Time Division Duplex). Furthermore, each of the high frequency modules 1, 1a, 1b, 1c, 1d, and 1e may include only a signal path for a transmission signal among a signal path for a transmission signal and a signal path for a reception signal. In this case, in each of the high frequency modules 1, 1a, 1b, 1c, 1d, and 1e, for example, the filters 32A to 32C are not duplexers but may be the transmission filters 12A to 12C, respectively.

Furthermore, although the plurality of filters 32A to 32C are acoustic wave filters using surface acoustic waves, the plurality of filters 32A to 32C are not necessarily acoustic wave filters using surface acoustic waves. The plurality of filters 32A to 32C may be, for example, acoustic wave filters using boundary acoustic waves, plate waves, or the like.

Each of a plurality of series-arm resonators and a plurality of parallel-arm resonators of an acoustic wave filter is not necessarily a SAW resonator and may be, for example, a BAW (Bulk Acoustic Wave) resonator.

Furthermore, the plurality of filters may be LC filters.

Furthermore, the multiplexer 3 is not necessarily a diplexer and may be, for example, a triplexer.

Furthermore, the communication apparatus 300 according to the first embodiment may include any of the high frequency modules 1a, 1b, 1c, and 1d instead of the high frequency module 1.

(Aspects)

Aspects described below are disclosed in this specification.

A high frequency module (1; 1a; 1b; 1c; 1d; 1e) according to a first aspect includes a power amplifier (11), a first switch (5), two or more filters (32A to 32C), a second switch (4), and an antenna terminal (81). The power amplifier (11) is capable of operating in a first power mode and a second power mode with a gain lower than a gain of the first power mode. The first switch (5) includes a first common terminal (50) and three or more first selection terminals (51 to 54), and the power amplifier (11) is connected to the first common terminal (50). The two or more filters (32A to 32C) are connected to two or more first selection terminals (51 to 53) other than at least one first selection terminal (54) among the three or more first selection terminals (51 to 54) of the first switch (5). The second switch (4) includes a second common terminal (40) and three or more second selection terminals (41 to 44), and the two or more filters (32A to 32C) are connected to two or more second selection terminals (41 to 43) other than at least one second selection terminal (44) among the three or more second selection terminals (41 to 44). The antenna terminal (81) is connected to the second common terminal (40). At least one first selection terminal (54) of the first switch (5) and at least one second selection terminal (44) of the second switch (4) are connected. The first switch (5) is capable of switching between a first path passing through at least one of the two or more filters (32A to 32C) and a second path not passing through any of the two or more filters (32A to 32C) but passing through the at least one first selection terminal (54).

The high frequency module (1; 1a; 1b; 1c; 1d; 1e) according to the first aspect can achieve a reduction of the current consumption of the power amplifier (11).

The high frequency module (1; 1a) according to a second aspect further includes a mounting substrate (9) in the first aspect. The mounting substrate (9) has a first main face (91) and a second main face (92) that face each other. The first switch (5) is arranged on the first main face (91) of the mounting substrate (9). The second switch (4) is arranged on the second main face (92) of the mounting substrate (9). The first switch (5) and the second switch (4) at least partially overlap when the first switch (5) and the second switch (4) are viewed in plan from a thickness direction (D1) of the mounting substrate (9).

In the high frequency module (1; 1a) according to the second aspect, the length of the wiring between the at least one first selection terminal (54) of the first switch (5) and the at least one second selection terminal (44) of the second switch (4) can be shortened.

In the high frequency module (1; 1a) according to a third aspect, a wiring (W10) that connects the at least one first selection terminal (54) to the at least one second selection terminal (44) has a straight line shape along the thickness direction (D1) of the mounting substrate (9) in the second aspect.

In the high frequency module (1; 1a) according to the third aspect, the length of the wiring (W10) between the at least one first selection terminal (54) of the first switch (5) and the at least one second selection terminal (44) of the second switch (4) can be shortened.

The high frequency module (1b; 1c; 1d) according to a fourth aspect further includes a mounting substrate (9) and an external connection terminal (80) in the first aspect. The mounting substrate (9) has a first main face (91) and a second main face (92) that face each other. The external connection terminal (80) is arranged on the second main face (92) of the mounting substrate (9). The power amplifier (11) is arranged on the first main face (91) of the mounting substrate (9). The first switch (5) and the second switch (4) are arranged on the second main face (92) of the mounting substrate (9).

In the high frequency module (1b; 1c; 1d) according to the fourth aspect, the length of the wiring between the at least one first selection terminal (54) of the first switch (5) and the at least one second selection terminal (44) of the second switch (4) can be shortened.

The high frequency module (1b; 1c) according to a fifth aspect includes an IC chip (100) that includes the first switch (5) and the second switch (4) in the fourth aspect.

In the high frequency module (1b; 1c) according to the fifth aspect, the length of the wiring between the first switch (5) and the second switch (4) can be shortened.

In the high frequency module (1b; 1c) according to a sixth aspect, the IC chip (100) includes a wiring (W10) that connects the at least one first selection terminal (54) to the at least one second selection terminal (44) in the fifth aspect.

In the high frequency module (1b; 1c) according to the sixth aspect, the wiring (W10) that connects the first switch (5) to the second switch (4) can be shortened.

In the high frequency module (1d) according to a seventh aspect, the first switch (5) and the second switch (4) are adjacent to each other when the first switch (5) and the second switch (4) are viewed in plan from the thickness direction (D1) of the mounting substrate (9) in the fourth aspect.

In the high frequency module (1d) according to the seventh aspect, the length of the wiring between the first switch (5) and the second switch (4) can be shortened.

The high frequency module (1; 1a; 1b; 1c; 1d) according to an eighth aspect further includes a controller (15) in any one of the first to seventh aspects. The controller (15) controls the power amplifier (11). The first switch (5) and the second switch (4) are controlled in accordance with a control signal from an outside of the high frequency module (1, 1a; 1b; 1c; 1d).

The high frequency module (1e) according to a ninth aspect further includes a controller (15e) in any one of the first to seventh aspects. The controller (15e) controls the power amplifier (11). The controller (15e) controls the first switch (5) and the second switch 4).

In the high frequency module (1e) according to the ninth aspect, the controller (15e) can control an operation of the power amplifier (11) and control switching between the first switch (5) and the second switch (4).

In the high frequency module (1e) according to a tenth aspect, the controller (15e) is capable of controlling the power amplifier (11), the first switch (5), and the second switch (4) in accordance with a control signal from an outside of the high frequency module (1e) in the ninth aspect.

In the high frequency module (1; 1a; 1b; 1c; 1d; 1e) according to an eleventh aspect, each of the two or more filters (32A to 32C) is a duplexer in any one of the first to tenth aspects.

A communication apparatus (300; 300e) according to a twelfth aspect includes a signal processing circuit (301) and the high frequency module (1; 1a; 1b; 1c; 1d; 1e) according to any one of the first to eleventh aspects. The power amplifier (11) of the high frequency module (1; 1a; 1b; 1c; 1d; 1e) amplifies a transmission signal from the signal processing circuit (301) and outputs the amplified transmission signal.

In the communication apparatus (300; 300e) according to the twelfth aspect, a reduction of the current consumption of the power amplifier (11) can be achieved.

1, 1a, 1b, 1c, 1d, 1e high frequency module
3 multiplexer
31A low pass filter
31B high pass filter
4 second switch
40 second common terminal
41 to 44 second selection terminal
5 first switch
50 first common terminal
51 to 54 first selection terminal
6 third switch
60 third common terminal
61 to 63 third selection terminal
11 power amplifier
12A, 12B, 12C transmission filter
13 output matching circuit
14A, 14B, 14C matching circuit
15, 15e controller
16 coupler
17 fourth switch
20 input matching circuit
21 low noise amplifier
22A, 22B, 22C reception filter
32A, 32B, 32C filter (duplexer)
80 external connection terminal
81 antenna terminal
82 signal input terminal 83 signal output terminal
84 control terminal
85 control terminal
86 terminal
87 monitor output terminal
89 ground terminal
9 mounting substrate
91 first main face
92 second main face
93 outer peripheral face
100 IC chip
101 first resin layer
1011 main face
1013 outer peripheral face
102 second resin layer
1021 main face
1023 outer peripheral face
300 communication apparatus
301 signal processing circuit
302 RF signal processing circuit
303 baseband signal processing circuit
310 antenna
D1 thickness direction
W1, W2, W3, W4, W5, W6, W7, W8, W9, W10, W11, W12 wiring

The invention claimed is:

1. A high frequency module comprising:
a power amplifier that is configured to operate in a first power mode and a second power mode, a gain of the power amplifier in the second power mode being lower than the gain of the power amplifier in the first power mode;
a first switch that includes a first common terminal and three or more first selection terminals, the power amplifier being connected to the first common terminal;
two or more filters that are connected to corresponding two or more first selection terminals other than at least one first selection terminal among the three or more first selection terminals of the first switch;
a second switch that includes a second common terminal and three or more second selection terminals, the two or more filters being connected to corresponding two or more second selection terminals other than at least one second selection terminal among the three or more second selection terminals; and
an antenna terminal that is connected to the second common terminal,
wherein the at least one first selection terminal of the first switch and the at least one second selection terminal of the second switch are connected, and
wherein the first switch is configured to switch between a first path passing through at least one of the two or more filters and a second path not passing through any of the two or more filters, but passing through the at least one first selection terminal.

2. The high frequency module according to claim 1, further comprising:
a mounting substrate having a first main face and a second main face that face each other,
wherein the first switch is arranged on the first main face of the mounting substrate,
wherein the second switch is arranged on the second main face of the mounting substrate, and
wherein the first switch and the second switch at least partially overlap when the first switch and the second switch are viewed in a plan view along a thickness direction of the mounting substrate.

3. The high frequency module according to claim 2, wherein a wiring that connects the at least one first selection terminal to the at least one second selection terminal has a straight line shape along the thickness direction of the mounting substrate.

4. The high frequency module according to claim 1, further comprising:
a mounting substrate having a first main face and a second main face that face each other; and
an external connection terminal that is arranged on the second main face of the mounting substrate,
wherein the power amplifier is arranged on the first main face of the mounting substrate, and
wherein the first switch and the second switch are arranged on the second main face of the mounting substrate.

5. The high frequency module according to claim 4, further comprising an integrated circuit (IC) chip that includes the first switch and the second switch.

6. The high frequency module according to claim 5, wherein the IC chip includes a wiring that connects the at least one first selection terminal to the at least one second selection terminal.

7. The high frequency module according to claim 4, wherein the first switch and the second switch are adjacent to each other when the first switch and the second switch are viewed in a plan view along a thickness direction of the mounting substrate.

8. The high frequency module according to claim 1, further comprising:
a controller configured to control the power amplifier,
wherein the first switch and the second switch are controlled in accordance with a control signal from outside of the high frequency module.

9. The high frequency module according to claim 1, further comprising:
a controller configured to control the power amplifier,
wherein the controller is configured to control the first switch and the second switch.

10. The high frequency module according to claim 9, wherein the controller is configured to control the power amplifier, the first switch, and the second switch in accordance with a control signal from outside of the high frequency module.

11. The high frequency module according to claim 1, wherein each of the two or more filters is a duplexer.

12. A communication apparatus comprising:
a signal processing circuit; and
the high frequency module according to claim 1,
wherein the power amplifier of the high frequency module is configured to amplify a transmission signal from the signal processing circuit and to output an amplified transmission signal.

* * * * *